United States Patent
Yano et al.

(10) Patent No.: US 12,484,144 B2
(45) Date of Patent: Nov. 25, 2025

(54) CIRCUIT PATTERN, SEMI-FINISHED BASE MATERIAL FOR CIRCUIT SUBSTRATE, METAL-BASED CIRCUIT SUBSTRATE, PRODUCTION METHOD FOR CIRCUIT PATTERN, AND PRODUCTION DEVICE FOR CIRCUIT PATTERN

(71) Applicant: NHK SPRING CO., LTD., Yokohama (JP)

(72) Inventors: Shinya Yano, Yokohama (JP); Misao Uetake, Hachioji (JP)

(73) Assignee: NHK Spring Co., Ltd., Yokohama (JP)

( * ) Notice: Subject to any disclaimer, the term of this patent is extended or adjusted under 35 U.S.C. 154(b) by 246 days.

(21) Appl. No.: 18/035,926

(22) PCT Filed: Oct. 19, 2021

(86) PCT No.: PCT/JP2021/038622
§ 371 (c)(1),
(2) Date: May 9, 2023

(87) PCT Pub. No.: WO2022/102357
PCT Pub. Date: May 19, 2022

(65) Prior Publication Data
US 2024/0023234 A1    Jan. 18, 2024

(30) Foreign Application Priority Data

Nov. 10, 2020   (JP) ................................. 2020-187555

(51) Int. Cl.
*H05K 1/02*  (2006.01)
*H05K 3/20*  (2006.01)

(52) U.S. Cl.
CPC ............. *H05K 1/0265* (2013.01); *H05K 3/20* (2013.01); *H05K 2201/0367* (2013.01); *H05K 2203/0369* (2013.01)

(58) Field of Classification Search
CPC ............... H05K 1/0242; H05K 1/0265; H05K 2201/0367; H05K 3/20
See application file for complete search history.

(56) References Cited

U.S. PATENT DOCUMENTS

| 4,858,073 A | 8/1989 | Gregory |
| 6,130,027 A | 10/2000 | Hamada |
| 2005/0161250 A1 | 7/2005 | Hiramoto |

FOREIGN PATENT DOCUMENTS

| EP | 3 007 526 A1 | 4/2016 |
| JP | 10-178256 A | 6/1998 |

(Continued)

OTHER PUBLICATIONS

Machine translation of JP 2017-117513 (Year: 2017).*

*Primary Examiner* — Jeremy C Norris
(74) *Attorney, Agent, or Firm* — Norris McLaughlin, P.A.

(57) ABSTRACT

A circuit pattern is obtained, capable of being easily applicable to current increase, making short circuit or ion migration between adjacent circuit conductors hard to be generated, and allowing a circuit pattern to be tightly arranged. A circuit pattern comprises a circuit conductor to be layered on a metal substrate through an insulating layer, an intermediate portion in a layer direction having a swelled shape in a layer-crossing direction in a cross section of the circuit conductor, and the swelled shape is formed by a gentle face in the layer direction.

14 Claims, 10 Drawing Sheets

(56) References Cited

FOREIGN PATENT DOCUMENTS

| | | |
|---|---|---|
| JP | 10-229153 A | 8/1998 |
| JP | 2002-335056 A | 11/2002 |
| JP | 2003-264360 A | 9/2003 |
| JP | 2004-193594 A | 7/2004 |
| JP | 2005-209920 A | 8/2005 |
| JP | 2005-264282 A | 9/2005 |
| JP | 2006-196656 A | 7/2006 |
| JP | 2015-170713 A | 9/2015 |
| JP | 2017-117513 A | 6/2017 |
| WO | 2012/031522 A1 | 3/2012 |

* cited by examiner

FIG.19( A )
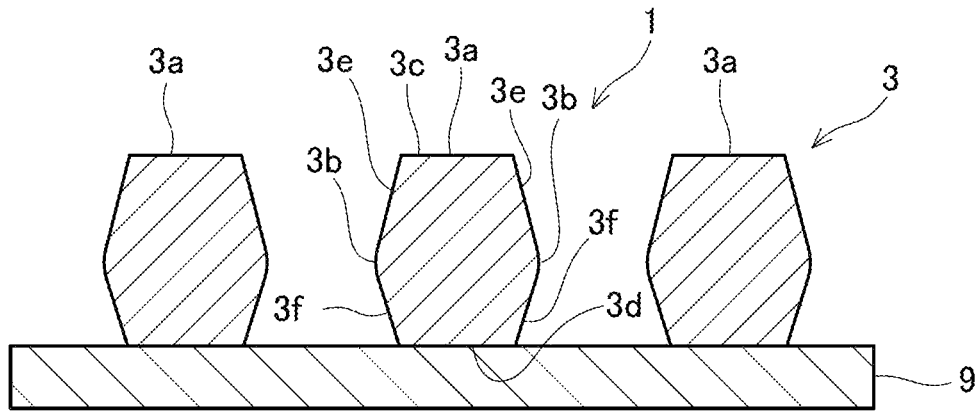
FIG.19( B )
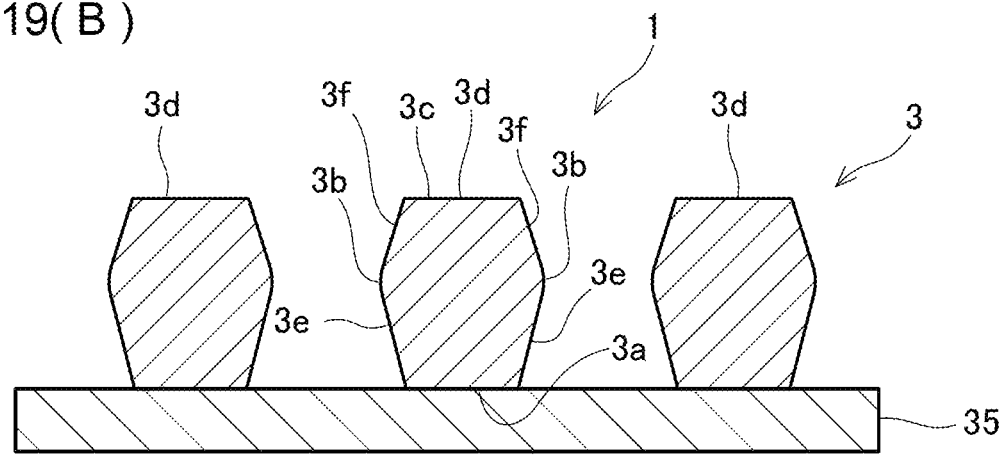
FIG.19( C )
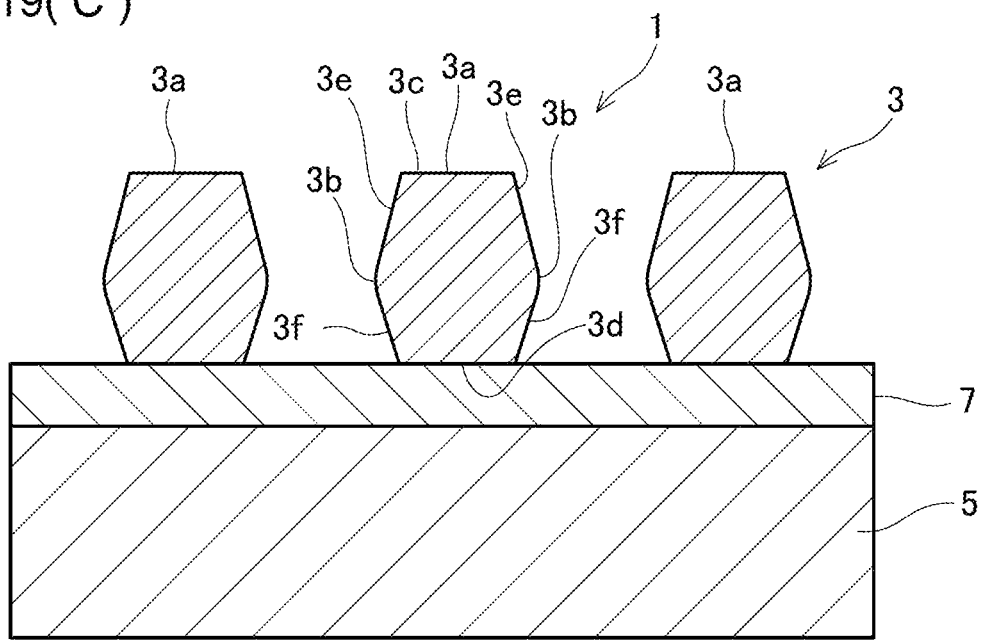

CIRCUIT PATTERN, SEMI-FINISHED BASE MATERIAL FOR CIRCUIT SUBSTRATE, METAL-BASED CIRCUIT SUBSTRATE, PRODUCTION METHOD FOR CIRCUIT PATTERN, AND PRODUCTION DEVICE FOR CIRCUIT PATTERN

FIELD OF THE INVENTION

The present invention relates to a circuit pattern, a semi-finished base material for a circuit substrate, a metal-based circuit substrate, a production method for a circuit pattern, and a production device for a circuit pattern.

BACKGROUND OF THE INVENTION

Conventionally, there is one having a cross section illustrated in FIG. 20 as a printed wiring board. A circuit pattern 103 of this printed wiring board 101 is formed by single-side etching performing etching to a metal foil only from an obverse face of an insulating substrate 105.

With the single-side etching, a cross section of an individual circuit conductors 103a of the finished circuit pattern 103 is formed into a trapezoidal shape. Forming the circuit pattern 103 with a tight arrangement, there is a problem to tend to cause disconnection at a top portion of the circuit pattern 103, short circuit and ion migration between adjacent circuit conductors 103a at a bottom of the circuit pattern.

In contrast, a printed wiring substrate described in Patent document 1 is formed by improved process of single-side etching. The printed wiring substrate is improved with a width at a bottom portion more than a width at a top portion in a cross section of a circuit conductor composing a circuit pattern.

In the printed wiring substrate described in Patent document 1, the sectional shape of the circuit conductor is, however, formed into the substantial reverse trapezoidal shape by the single-side etching, the substantial conical shape or the substantial drum shape. It restricts increase in a sectional area of the circuit conductor to be limited on application to large current.

On the other hand, a printed wiring board 101 with a cross section illustrated in FIG. 21 is proposed in Patent document 2.

A circuit pattern 103 of the printed wiring board 101 is formed by double-side etching performing etching at both an obverse and a reverse of a metal foil.

In the double-side etching, a film-like protection material or the like is adhered to one side face of a single body of the metal foil being material, first.

On the other side face of the metal foil, a patterned resist is formed and a first side etching is conducted. A parts corresponding to the circuit pattern 103 is formed up to and intermediate portion in a layer direction on the other side face of the metal foil by the first side etching.

Next, the other side face of the metal foil is adhered at the other face of the part corresponding to the circuit pattern 103 on an obverse face an insulating substrate 105 with pressing and heating.

Further, a patterned resist is formed on the one side face of the metal foil and a second side etching is conducted from the one side face. The part corresponding to the circuit pattern 103 is formed up to the intermediate portion in the layer direction on the one side face of the metal foil by the second side etching.

As a result, the printed wiring board 101 is completed to have the circuit pattern 103 of the cross section illustrated in FIG. 21 on the insulating substrate 105.

According to the printed wiring board 101, the circuit pattern 103 is formed so as to have the thickness of the metal foil thinner than the actual thickness through the double-side etching. Further, the cross section of the individual circuit conductor 103a composing the circuit pattern 103 is a swelled shape in a crossing direction (layer-crossing direction) to the layer direction at the intermediate portion in the layer direction. A sectional area of the circuit conductor 103a is, therefore, increased to be easily applied to current increase.

The simple both-side etching, however, performs etching from both the obverse and the reverse sides of the metal foil. Accordingly, the intermediate portion 103ab in the layer direction of the individual circuit conductor 103a of the circuit pattern 103 is a sharply pointed swelled shape along the obverse face of the insulating substrate 105.

In the circuit pattern 103 of FIG. 21, the sectional shape of the individual circuit conductor 103a is, therefore, a substantial trapezoidal shape with a bottom portion being the pointed intermediate portion 103ab on the obverse face of the insulating substrate 105. This results in remaining the problem to tend to cause short circuit between adjacent circuit conductors 103a and ion migration on the insulating substrate 105 similar to the circuit pattern 103 of FIG. 20.

Patent Document 1: JP 2005-209920 A
Patent Document 2: JP H10-178256 A

SUMMARY OF THE INVENTION

A problem to be solved is that, in the case of the swelled shape in the layer-crossing direction at the intermediate portion in the layer direction, the sectional shape of the individual circuit conductor is the substantial trapezoidal shape with the bottom portion being the sharply pointed intermediate portion in the layer-crossing direction on the obverse face of the insulating substrate, and this results in remaining the problem to tend to cause short circuit and ion migration between adjacent circuit conductors to limit on tight arrangement of the circuit pattern.

A circuit pattern according to the present invention is a circuit pattern comprising a circuit conductor to be layered on a metal substrate through an insulating layer, comprising an intermediate portion in a layer direction having a swelled shape in a layer-crossing direction in a cross section of the circuit conductor, wherein the swelled shape is formed by a gentle face in the layer direction.

A semi-finished base material for a circuit substrate according to the present invention is that the circuit pattern is layered on a protection sheet.

A metal-based circuit substrate according to the present invention is a metal-based circuit substrate in which a circuit pattern comprising a circuit conductor is layered on an insulating layer layered on a metal substrate, comprising an intermediate portion in a layer direction having a swelled shape in a layer-crossing direction relative to at least a portion located on an obverse face of the insulating layer in a cross section of the circuit conductor.

A production method for a circuit pattern according to the present invention, comprises a pattern formation step performing double-side etching to a material plate to form a semi-finished circuit pattern in which portions corresponding to individual circuit conductors composing a circuit pattern are connected through relatively thin connection portions, and a circuit formation step performing single-side etching to the connection portions from one side face of the semi-finished circuit pattern to form a circuit pattern in which intermediate portions of the circuit conductors in a cross section in a layer direction are formed into a swelled shape and the swelled shape is formed with a gentle face in the layer direction.

A production device for a circuit pattern according to the present invention, comprises a pattern formation device performing double-side etching to a material plate to form a semi-finished circuit pattern in which portions corresponding to individual circuit conductors composing a circuit pattern are connected through relatively thin connection portions, and a circuit formation device performing single-side etching to the connection portions from one side face of the semi-finished circuit pattern to form the circuit pattern in which intermediate portions of the circuit conductors in a cross section in a layer direction are formed into a swelled shape and the swelled shape is formed with a gentle face in the layer direction.

The circuit pattern according to the present invention increases a sectional area of the circuit conductor according to the swelled shape of the intermediate portion, so that it is easily applied to current increase and it is advantageous for large current. Since the swelled shape is formed with the gentle face in the layer direction, short circuit at this portion relative to an adjacent circuit conductor is suppressed.

The semi-finished base material for a circuit substrate according to the present invention layers the circuit pattern on the protection sheet, thereby keeping the circuit pattern having the swelled shape in stock.

The metal-based circuit substrate according to the present invention is easily applied to current increase and is advantageous for large current. Further, it suppresses generation of ion migration between adjacent circuit conductors, thereby allowing the circuit pattern to be tightly arranged.

The production method for a circuit pattern according to the present invention produces a circuit pattern to be easily applied to current increase and be advantageous for large current. Further, it allows the circuit pattern to be more tightly arranged according to suppressing short circuit and generation of ion migration between adjacent circuit conductors.

The production device for a circuit pattern according to the present invention realizes the production method for a circuit pattern.

BRIEF DESCRIPTION OF THE DRAWINGS

FIG. 19(A) is a schematic sectional view illustrating the circuit pattern on a protection film cut off from the semi-finished base material for a circuit substrate;

FIG. 19(B) is a schematic sectional view illustrating the circuit pattern transferred to the cushion material;

FIG. 19(C) is a schematic sectional view illustrating the circuit pattern transferred to the insulating layer on the metal substrate;

EMBODIMENT FOR CARRYING OUT THE INVENTION

Figure 1A:
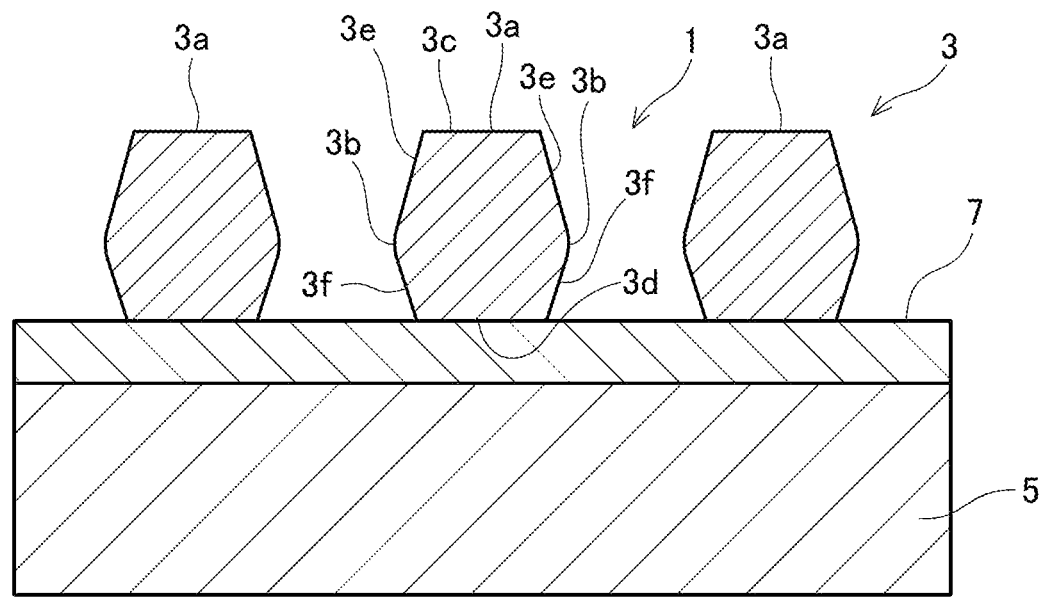
FIG. 1(A) is a schematic sectional view of a metal-based circuit substrate according to an embodiment of the present invention, in which swelled shapes are located closer to lower portions relatively to vertical centers in a layer direction of circuit conductors.

The present invention accomplishes an object to be easily applied to current increase, be hard to generate short circuit or ion migration between adjacent circuit conductors and allow a circuit pattern to be tightly arranged as follows.

In the present invention, a circuit pattern comprising a circuit conductor to be layered on a metal substrate through an insulating layer, comprises an intermediate portion in a layer direction having a swelled shape in a layer-crossing direction in a cross section of the circuit conductor, the swelled shape being formed by a gentle face in the layer direction. The layer direction means a layering direction or a thickness direction of the circuit conductor, and the layer-crossing direction is a crossing direction relative to the layer direction.

The swelled shape of the intermediate portion in the layer direction in the cross section of the circuit conductor is formed circumferentially entirely on circumferential side faces in a circumferential direction of the circumferential side faces of the circuit conductor, but it may be partially formed.

The intermediate portion in the layer direction means an arbitrary position between upper and lower faces of the circuit conductor in the layer direction.

The gentle face in the layer direction of the circuit conductor means that it has no sharp point in the layer-crossing direction, and is a convex surface in the layer-crossing direction for example. The gentle face is, however, enough not to be sharply pointed in the layer-crossing direction, and need not be a curved surface. Namely, the gentle face may be a sagging convex surface, a deformed convex surface or the like.

The swelled shape of the intermediate portion in the layer direction in the cross section of the circuit conductor is formed using double-side etching or single-side etching by means of wet etching, but any processing methods may be employed as long as the same shape is allowed to be formed.

In the circuit conductor, a width of a lower face contacting the insulating layer is wider than a width of an upper face in the cross section in the layer direction, or the width of the lower face contacting the insulating layer is narrower than the width of the upper face in the cross section in the layer direction. In addition, the circuit conductor may have the equivalent widths of the upper and the lower faces.

A circuit pattern of a semi-finished base material for a circuit substrate may be configured to be layered on a protection sheet. As the protection sheet, one used for the etching may be used as it is. A protection sheet different from the protection sheet used for the etching may be, however, used. A size of the protection sheet is preferably in accordance with the circuit pattern. The protection sheet preferably has flexibility, but may be a rigid one.

The circuit pattern of the semi-finished base material for a circuit substrate has a thickness more than 0.8 mm.

The circuit pattern is a pattern having a thickness according to needs for large current. The thickness of the circuit pattern may be, however, variously selected according to current specifications. Namely, the circuit pattern should be easily applied to current increase by means of the swelled shape in the cross section of the circuit conductor in comparison with a case that a cross section of a circuit conductor has no swelled shape. An upper limit and a lower limit of the thickness of the circuit pattern is in a range of common general knowledge for the circuit pattern. The circuit pattern may be formed of a copper foil, a rolled copper plate, an aluminum plate or the like.

A metal-based circuit substrate according to the present invention is a metal-based circuit substrate in which a circuit pattern comprising a circuit conductor is layered on an obverse face of an insulating layer layered on a metal substrate, comprises an intermediate portion in a layer direction having a swelled shape in a layer-crossing direction relative to at least a portion located on an obverse face of the insulating layer in a cross section of the circuit conductor.

Layering the circuit pattern comprising the circuit conductor on the obverse face of the insulating layer is a condition that the lower face of the circuit conductor is in contact with the obverse face of the insulating layer or is slightly embedded therein. In this case, the swelled shape includes a sharply pointed shape in the layer-crossing direction. The swelled shape may be formed by the gentle face in the layer direction.

In the circuit pattern of the metal-based circuit substrate, the circumferential side faces of the circuit conductor may be molded with resin on the insulating layer. A thickness and a planar shape of the metal substrate may be set according to specifications of the meta-based circuit substrate.

A production method for a circuit pattern according to the present invention comprises a pattern formation step and a circuit formation step. The pattern formation step performs double-side etching to a material plate to form a semi-finished circuit pattern in which portions corresponding to individual circuit conductors composing a circuit pattern are connected through relatively thin connection portions. The circuit formation step performing single-side etching to the connection portions from one side face of the semi-finished circuit pattern to form a circuit pattern in which intermediate portions of the circuit conductors in a cross section in a layer direction are formed into a swelled shape and the swelled shape is formed with a gentle face in the layer direction.

The etching to both sides of the material plate may be any one of simultaneously performing the etching to the both sides or performing the etching each side separately.

The portions corresponding to the circuit conductors means portions corresponding to the circuit conductors of the metal-based circuit substrate, are connected with each other by the connection portions, and semi-finished products of the circuit conductors.

The thin connection portion may be formed at an arbitrary position in the intermediate portion in the layer direction of the circuit conductor.

The relatively thin connection portion means that the connection portion is thin relatively to the circuit conductor.

The semi-finished circuit pattern is a semi-finished condition as the circuit pattern, in which an outline of the circuit pattern is formed by the double-side etching to the material plate and portions corresponding to the circuit conductors of the circuit pattern are connected with each other by the connection portions. Namely, the semi-finished circuit pattern is the result of the double-side etching to the material plate.

The one side face of the semi-finished circuit pattern is any one of an obverse and a reverse of the semi-finished circuit pattern, and a selected face is the one side face and another face relative to this one side face is the other face.

The production method for a circuit pattern may include a step of layering the produced circuit pattern on the metal substrate through the insulating layer in addition to the pattern formation step and the circuit formation step.

The pattern formation step forms the semi-finished circuit pattern being circumferentially provided with a tongue portion on an outermost circumference of a portion of the semi-finished circuit pattern corresponding to the circuit pattern, the tongue portion having a shape corresponding to the connection portions, and the circuit formation step performs the single-side etching to the connection portions and the tongue portion to form the aforementioned swelled shape.

The portion corresponding to the circuit pattern is a portion corresponding to the circuit pattern of the metal-based circuit substrate, and is configured by a combination of the portions corresponding to the individual circuit conductors connected together through the connection portions.

The tongue portion having the shape corresponding to the connection portions means is a shape removable together with the connection portions by the single-side etching, dimensions in thickness and width of which are substantially the same as those of the connection portions for example.

The circuit formation step includes a sheet-layering step that forms a resist pattern on the one side face of the semi-finished circuit pattern to expose the connection portions outside or expose the connection portions and the tongue portion outside and layers a protection sheet on the other side face of the semi-finished circuit pattern, and the circuit formation step performs the single-side etching from the one side face through the resist pattern.

The circuit formation step removes the resist pattern after the single-side etching to obtain the semi-finished base material for a circuit substrate having the circuit pattern layered on the protection sheet.

A production device for a circuit pattern according to the present invention, comprises a pattern formation device and a circuit formation device. The pattern formation device performing double-side etching to a material plate to form a semi-finished circuit pattern in which portions corresponding to individual circuit conductors composing a circuit pattern are connected with each other through relatively thin connection portions. The circuit formation device performing single-side etching to the connection portions from one side face of the semi-finished circuit pattern to form the circuit pattern in which intermediate portions of the circuit conductors in a cross section in a layer direction are formed into a swelled shape and the swelled shape is formed with a gentle face in the layer direction.

The production device for a circuit pattern comprises a layering device that forms a resist pattern on the one side face of the semi-finished circuit pattern to and layers a protection sheet on the other side face of the semi-finished circuit pattern, and the circuit formation device performs the single-side etching from the one side face through the resist pattern.

The circuit formation device removes the resist pattern after the single-side etching to form the semi-finished base material for a circuit substrate having the circuit pattern layered on the protection sheet.

Figure 1B:
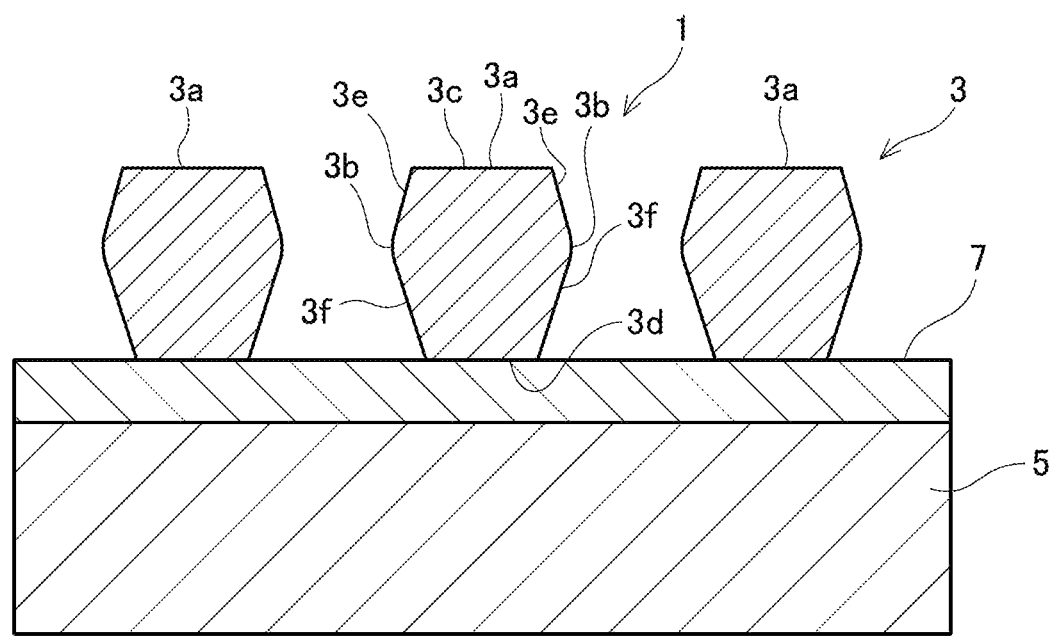
FIG. 1(B) is a schematic sectional view of a metal-based circuit substrate in which swelled shapes are located closer to upper portions relatively to the vertical centers in the layer direction of circuit conductors by contrast with FIG. 1(A)

FIG. 1(A) is a schematic sectional view of a metal-based circuit substrate in which swelled shapes are located closer to lower portions relatively to vertical centers in a layer direction of circuit conductors, and FIG. 1(B) is a schematic sectional view of a metal-based circuit substrate in which swelled shapes are located closer to upper portions relatively to vertical centers in the layer direction of circuit conductors.

In addition, in the following explanation, the layer direction means a layering direction of the metal-based circuit substrate. A layer-crossing direction means a planar direction of the metal-based circuit substrate. An upside means an upside in a direction of gravity when the metal-based circuit substrate is horizontally placed. A downside means a downside in the direction of gravity when the metal-based circuit substrate is horizontally placed.

Figure 2:
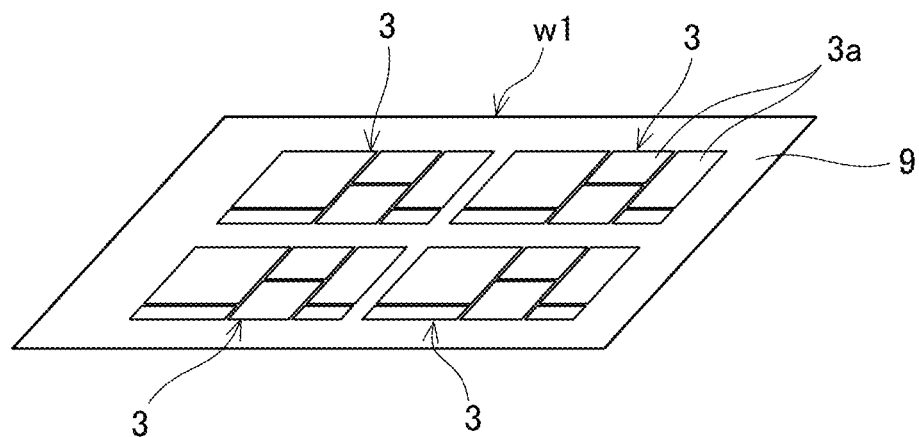
FIG. 2 is a perspective view of a semi-finished base material for a circuit substrate.

The metal-based circuit substrate 1 of FIG. 1 is provided with a thick circuit pattern 3 according to needs for large current. The metal-based circuit substrates 1 of FIGS. 1(A) and (B) have basically the same structure, although the metal-based circuit substrates are different from each other in swelled shapes located closer to lower portions and located closer to upper portions relatively to vertical centers. Accordingly, the structure of the metal-based circuit substrate 1 is explained mainly using FIG. 1(A), and the metal-based circuit substrate 1 of FIG. 1(B) and a cross section of the circuit conductors of FIG. 2 are referred if needed.

As illustrated in FIG. 1(A), the metal-based circuit substrate 1 is produced using to a semi-finished base material for a circuit substrate be explained later. The metal-based circuit substrate 1 is that the circuit pattern 3 is layered on a metal substrate 5 through an insulating layer 7.

The circuit pattern 3 is formed of, for example, copper, and is formed of copper material for a circuit having a thickness of 3.0 mm more than 0.8 mm applicable to large current according to the present embodiment.

The circuit pattern 3 is provided with a plurality of circuit conductors 3a electrically isolated. A structure of the plurality of circuit conductors 3a is formed according to required characteristics of the circuit pattern 3.

A thickness of the circuit conductor 3a in the layer direction is selected in a range of 0.8-3.0 mm. The thickness of the circuit conductor 3a in the layer direction may be, however, selected outside the range according to specifications of the metal-based circuit substrate 1.

In the cross section of the circuit conductor 3a, an intermediate portion in the layer direction is a swelled shape in the layer-crossing direction relative to at least a lower face 3a that is a portion located on the insulating layer 7. According to the present embodiment, the intermediate portion in the layer direction is the swelled shape in the layer-crossing direction relative to an upper and the lower faces 3c and 3d. The swelled shape is formed by a gentle face 3b in the layer direction. The gentle face 3b in the layer direction is a convex surface. Each circuit conductor 3a has a shape in which the similar sectional shape is continuous in the circumferential direction.

The intermediate portion of the circuit conductor 3a in the layer direction is a position of the circuit conductor 3a between the upper and the lower faces 3c and 3d in the layer direction. The face 3b of the swelled shape of FIG. 1(A) is slightly closer to the lower face 3d relatively to the vertical center of the circuit conductor 3a. The face 3b of the swelled shape of the circuit conductor 3a of FIG. 1(B) is slightly closer to the upper face 3c relatively to the vertical center of the circuit conductor 3a.

The gentle face 3b in the layer direction is continuous in the layer direction with no sharply pointed portions (sharp point) in the layer-crossing direction or no angled portions. The convex surface of the face 3b is gradually continuous in an arc shape.

Figure 4:
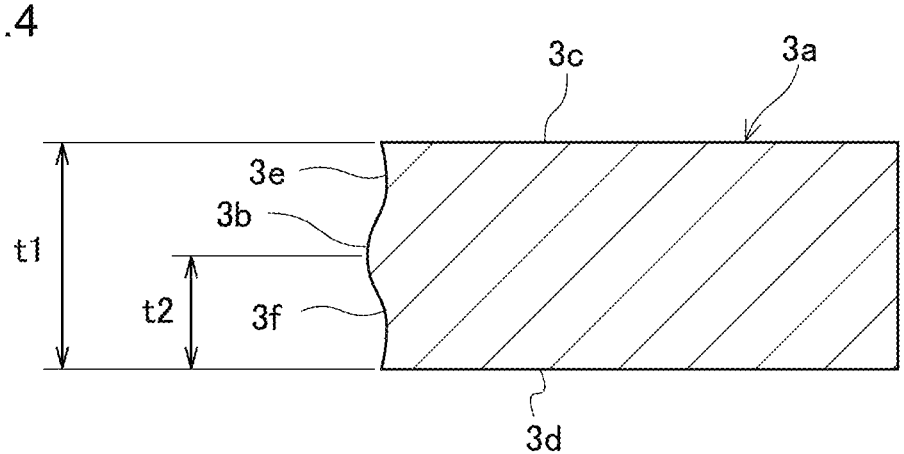
FIG. 4 is a partially enlarged sectional of a circuit conductor.

An upside and a downside faces 3e and 3f relative to the face 3b of the swelled shape are inclined faces being substantially straight and continuous to the face 3b. It should be noted that the faces 3e and 3f may be formed in concave faces as illustrated in FIG. 4 to be explained later.

The lower face 3d of the circuit conductor 3a illustrated in FIG. 1(A) has a width wider than of the upper face 3c. In the circuit conductor 3a illustrated in FIG. 1(B), the width of the upper face 3c is formed wider than the width of the lower face 3d contrary to the circuit conductor 3a of FIG. 1(A).

In the circuit conductors 3a illustrated in FIG. 1(A), a distance spanning between the faces 3b of the swelled shapes of the circuit conductors 3a is set to about 2 mm, and a distance between the lower faces 3d is about 2.1 mm. In the circuit conductors 3a illustrated in FIG. 1(B), in a case that a distance spanning between the faces 3b of the swelled shapes of the circuit conductors 3a is set to about 2 mm, a distance between the lower faces 3d is about 2.2 mm.

Figure 20:
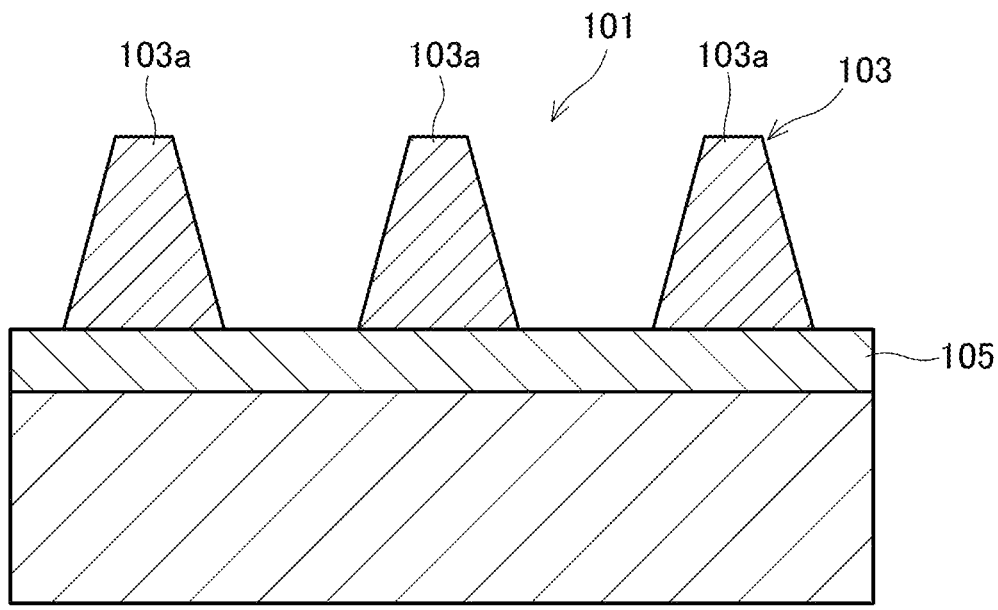
FIG. 20 is a schematic sectional view of a metal-based circuit substrate according to a related art.
Figure 21:
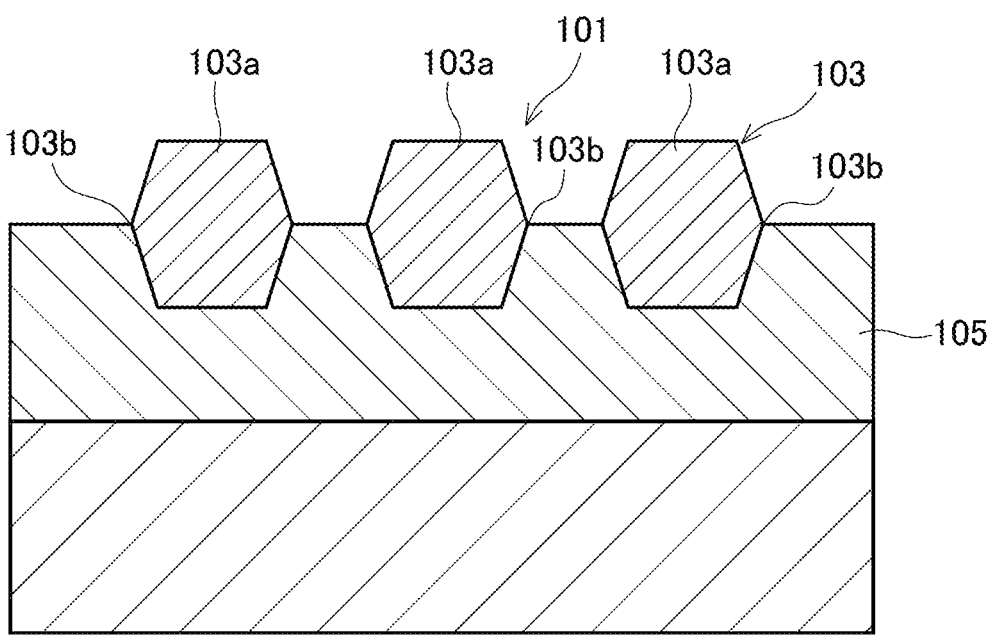
FIG. 21 is a schematic sectional view of a metal-based circuit substrate according to another related art.

In comparison with the conventional printed wiring boards 101 of FIG. 20 and FIG. 21, a distance between the circuit conductors 103a on the obverse face of the insulating layer 105 is 2 mm and is narrower than of the metal-based circuit substrates 1 of FIGS. 1(A) and (B).

The insulating layer 7 functions to electrically insulate the circuit pattern 3 from the metal substrate 5 and additionally functions as an adhesive bonding them together. Resin is, therefore, used generally for the insulating layer 7.

A thickness of the insulating layer is set to 60-150 μm. The insulating layer 7 needs for high heat resistance against high heat buildup of elements mounted on the circuit pattern 3 and for high heat transference to transfer that heat to the metal substrate 5. For this, it is preferable that the insulating layer 7 additionally includes inorganic fillers.

As matrix resin of the insulating layer 7, for example, epoxy resin such as bisphenol A epoxy resin, bisphenol F epoxy resin, or triazine type epoxy resin, cyanate resin such as bisphenol E cyanate resin, bisphenol A cyanate resin, or novolak cyanate resin and the like are used singly or as a mixture of two or more kinds thereof. Further, a curing agent such as amin, or phenol resin is used along with the epoxy resin.

The curing agent may be a mixture of two or more kinds of, for example, the homologous amin compounds. Further, a catalytic agent may be added for curing.

It is preferable that the inorganic fillers included in the insulating layer 7 are superior in electric insulation and has high heat conductivity. For example, alumina, silica, aluminum nitride, boron nitride, silicon nitride, magnesium oxide and the like are enumerated, and selected one or two or more kinds of them are used as inorganic fillers.

A filling rate of the inorganic fillers in the insulating layer 7 is appropriately set according to kinds of the inorganic fillers. For example, the filling rate of the inorganic fillers 85 vol % or less, preferably 30-85 vol % based on a whole volume of the matrix resin included in the insulating layer 7.

The insulating layer 7 may include, for example, coupling agents, dispersants and the like other than the aforementioned matrix resin and the inorganic fillers.

In addition, as the insulating layer 7, a semi-cured insulating sheet may be used.

The metal substrate 5 is made of, for example, elementary metal or alloy. As material of the metal substrate 5, aluminum, iron, copper, aluminum alloy, or stainless steel may be used for example. The metal substrate 5 may further include non-metal such as carbon. For example, the metal substrate 5 may includes carbon and aluminum composite. Further, the metal substrate 5 may have a single layer structure or a multi-layer structure.

The metal substrate 5 has high heat conductivity. For example, the copper material has the heat conductivity of 370-400 W·m−1·k−1, the aluminum material has the heat conductivity of 190-220 W·m·1·k−1, and the iron material has the heat conductivity of 60-80 W·m−1·k−1.

The metal substrate 5 may have flexibility or no flexibility. A thickness of the metal substrate 5 is set within a range of, for example, 1.0-3.0 mm.

In addition, the metal-based circuit substrate 1 may be configured as a metal-based circuit substrate using a metal substrate having a heat sink shape.

In the metal-based circuit substrate 1, the swelled shape is formed by the face 3b that is gentle in the layer direction and is the convex surface in the layer-crossing direction at the intermediate portion of the circuit conductor 3a in the layer direction as mentioned above.

Accordingly, a sectional area of the circuit conductor 3a is increased by the swelled shape of the intermediate portion of the circuit conductor 3a. The metal-based circuit substrate 1 is, therefore, easily applied to current increase and is advantageous for large current.

Since the swelled shape of the circuit conductor 3a is formed by the face 3b being gentle in the layer direction, short circuit at this portion relative to an adjacent circuit conductor 3a is suppressed.

In the circuit conductors 3a illustrated in FIGS. 1(A) and (B), the width of the lower face 3d of the circuit conductor 3a layered on the insulating layer 7 is smaller than the width at the face 3b of the intermediate portion. It, therefore, suppresses generation of ion migration between the circuit conductors 3a on the insulating layer 7.

Since it suppresses short circuit and generation of ion migration between the adjacent circuit conductors 3a, the metal-based circuit substrate 1 allows the circuit pattern 3 to be tightly arranged. In particular, the circuit conductor 3a illustrated in FIG. 1(A) in which the width of the lower face 3d is wider than the width of the upper face 3c makes adhesive strength relative to the insulating layer 7 larger than the circuit conductor 3a illustrated in FIG. 1(B).

Figure 3:
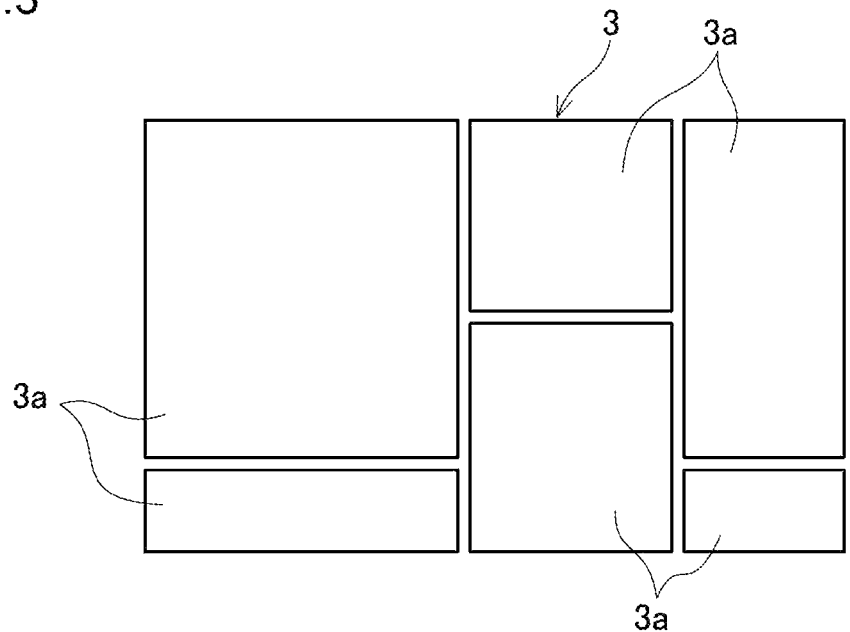
FIG. 3 is a plan view of a circuit pattern.

FIG. 2 is a perspective view of a semi-finished base material for a circuit substrate, FIG. 3 is a plan view of the circuit pattern. FIG. 4 is a partially enlarged sectional of the circuit conductor.

As illustrated in FIG. 2, the semi-finished base material W1 for a circuit substrate according to the embodiment of the present invention is formed by layering the circuit pattern 3 on a protection sheet 9. The semi-finished base material W1 is produced by a production method for a circuit pattern using double-side etching and single-side etching as explained later.

The protection sheet 9 is a back protection film used as it is, the back protection film laminated, when the single-side etching is performed from one side face of the semi-finished circuit pattern, on the other side face of the semi-finished circuit pattern as explained later.

Although the circuit pattern 3 is generally as mentioned above, a typical sectional shape of the circuit pattern is as illustrated in FIG. 4 if the circuit pattern is produced by the double-side etching and the single-side etching of wet etching to the copper plate material. The production method using the double-side etching and the single-side etching will be explained later.

In FIG. 4, the face 3b being the arc-shaped convex surface is formed at the center between the upper and the lower faces 3c and 3d of the circuit conductor 3a or slightly closer to the upper face 3c relatively to the center (t1−t2≤t2).

The upside and the downside faces 3e and 3f relative to the face 3b having the swelled shape are formed into concave shapes. The face 3b and the faces 3e and 3f are smoothly continuous in the layer direction on the circumferential faces of the circuit conductor 3a. The face 3b is protruded from the upper and the lower faces 3c and 3d in the layer-crossing direction.

The metal-based circuit substrate 1 is, therefore, produced using the circuit pattern 3 of the semi-finished base material W1 for a circuit substrate.

Figure 5:
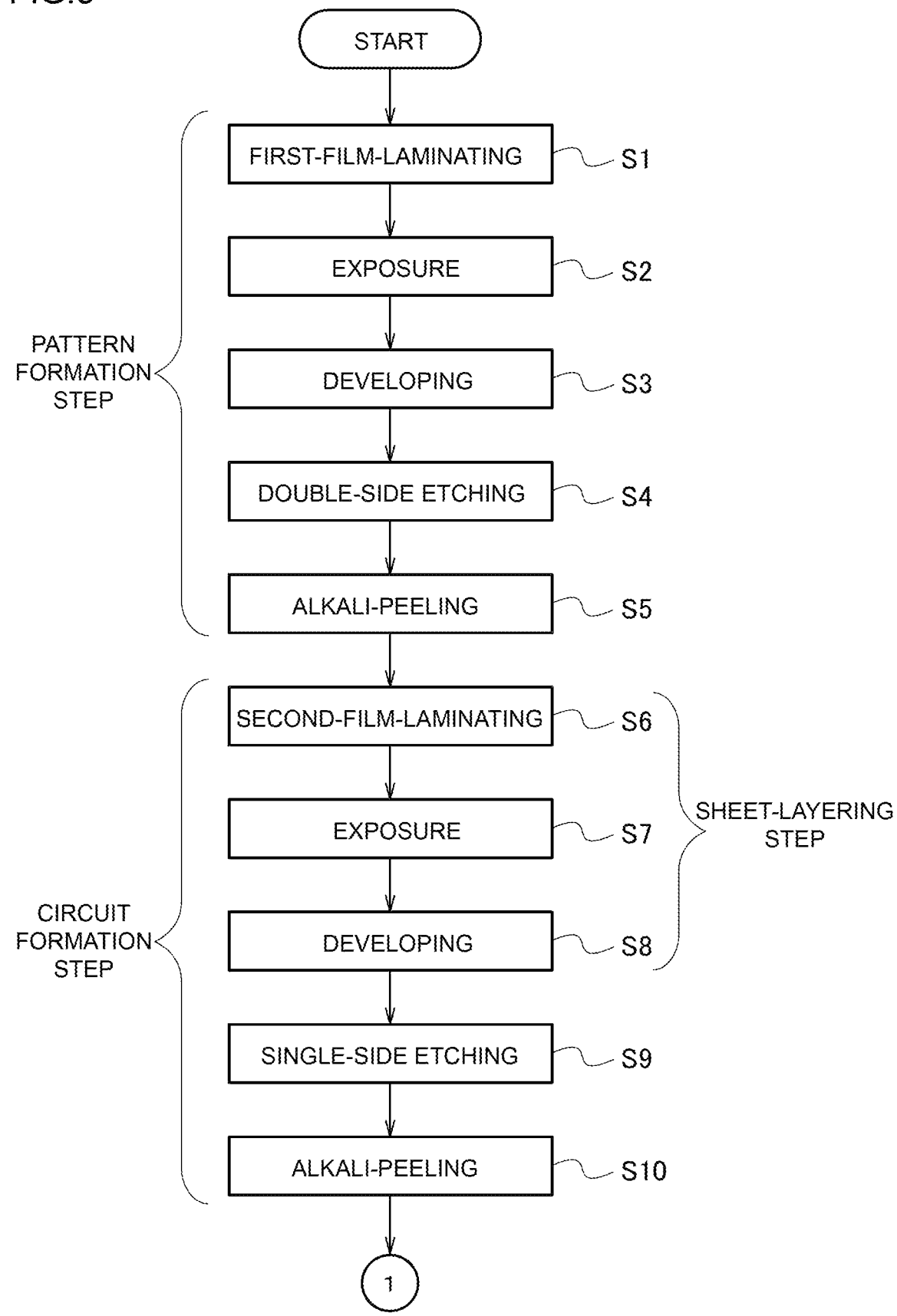
FIG. 5 is a process chart illustrating a production method for a circuit pattern.
Figure 6:
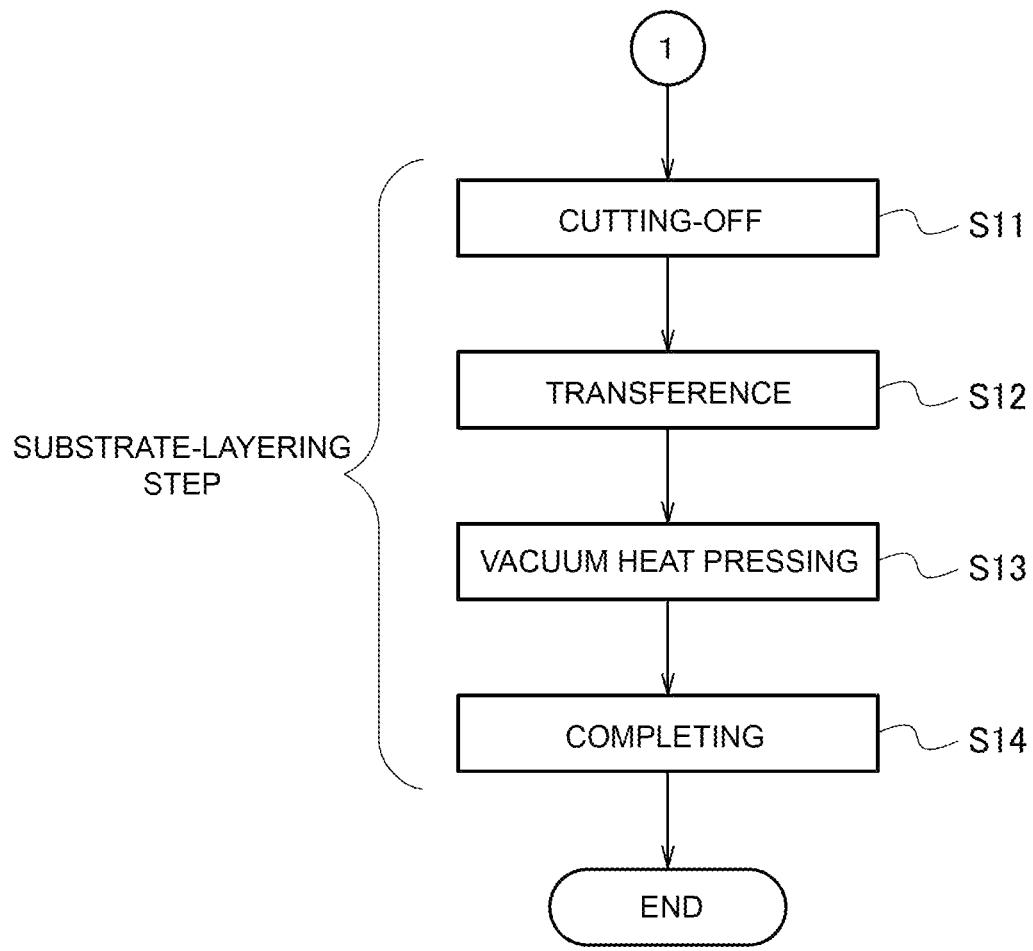
FIG. 6 is a process chart illustrating a production method for a metal-based circuit substrate that is a subsequent process of the production method for a circuit pattern.

FIG. 5 is a process chart illustrating the production method for a circuit pattern. FIG. 6 is a process chart illustrating a production method for a metal-based circuit substrate that is a subsequent process of the production method for a circuit pattern. Although the production method for a circuit pattern and the production method for a metal-based circuit substrate are realized as a sequential line according to the embodiment, these production methods may be realized as separated lines.

As illustrated in FIG. 5, the production method for a circuit pattern is provided with a pattern formation step S1-S5 and a circuit formation step S6-S10. Further, the circuit formation step S6-S10 includes a sheet-layering step S6-S8.

The pattern formation step S1-S5 performs the double-side etching to a copper foil or a copper plate material as material plate. Accordingly, the semi-finished circuit pattern is formed, the semi-finished circuit pattern in which portions corresponding to the individual circuit conductors 3a composing the circuit pattern 3 are connected with each other through relatively thin connection portions (explained later).

The circuit formation step S6-S10 performs the single-side etching to the connection portions and a tongue portion (explained later) on an outermost circumference of the circuit pattern from the one side face of the semi-finished circuit pattern (explained later). This obtains the circuit pattern 3 in which the intermediate portion of the circuit conductor 3a in the cross section in the layer direction is formed into the swelled shape and the swelled shape is formed with the gentle face 3b in the layer direction.

A second-film-laminating step S6 as the sheet-layering step forms a resist pattern (explained later) on the one side face of the semi-finished circuit pattern to expose the connection portions and the tongue portion outside and layers the protection sheet (explained later) on the other side face of the semi-finished circuit pattern.

The pattern formation step S1-S5 is performed by a pattern formation device (explained later). The circuit formation step S6-S10 is performed by a circuit formation device (explained later). The sheet-layering step S6-S8 is performed by a layering device (explained later).

In the circuit formation step S6-S10, the single-side etching from the one side face is performed through the resist pattern.

Then, the circuit formation step S6-S10 removes the resist pattern after the single-side etching to obtain the semi-finished base material W1 for a circuit substrate having the circuit pattern 3 layered on the protection sheet. The semi-finished base material W1 for a circuit substrate is used for production of the metal-based circuit substrate 1 according to a substrate-layering step S11-S14. The semi-finished base material W1 for a circuit substrate may be isolated from the sequential production line and be kept in stock as it is.

The pattern formation step S1-S5 and the circuit formation step S6-S10 of FIG. 5 will be explained further with reference to FIG. 7-FIG. 13. FIG. 7-FIG. 11 are related to the pattern formation device realizing the pattern formation step S1-S5, and FIG. 12-FIG. 13 are related to the circuit formation device realizing the circuit formation step S6-S10.

Figure 7:
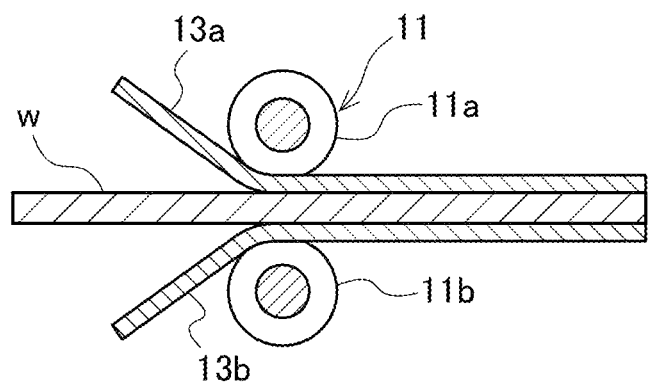
FIG. 7 is a schematic sectional view illustrating a laminating situation of a first laminating device in a pattern formation device.
Figure 8:
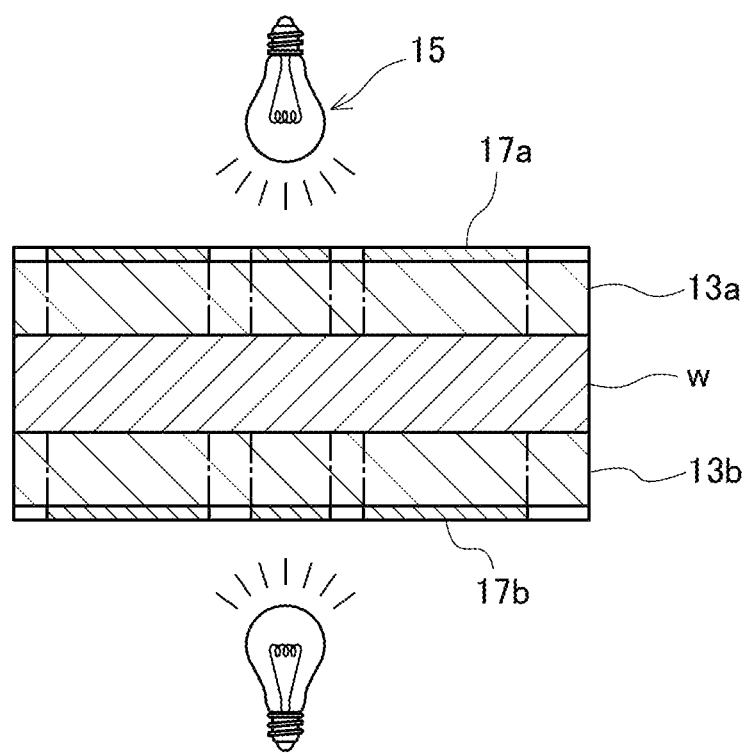
FIG. 8 is a schematic sectional view illustrating an exposure situation at an exposure device in the pattern formation device.
Figure 9:
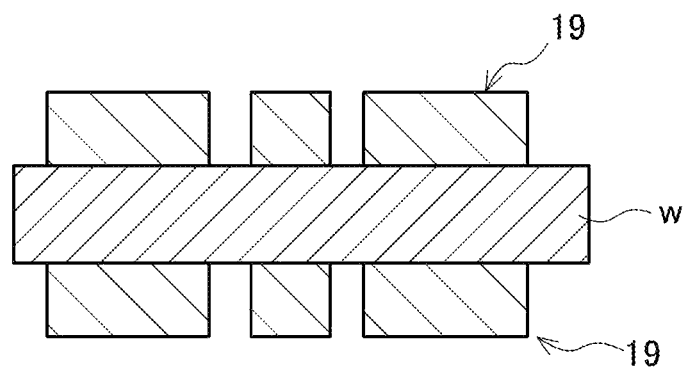
FIG. 9 is a schematic sectional view illustrating a developing situation at a developing device in the pattern formation device.
Figure 10:
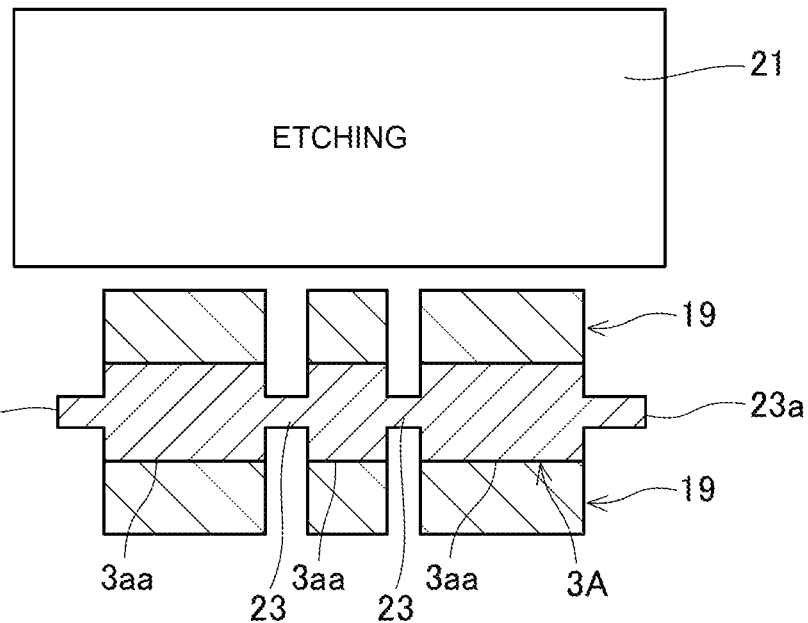
FIG. 10 is a schematic sectional view illustrating an etching situation at a double-side etching device in the pattern formation device.
Figure 11:
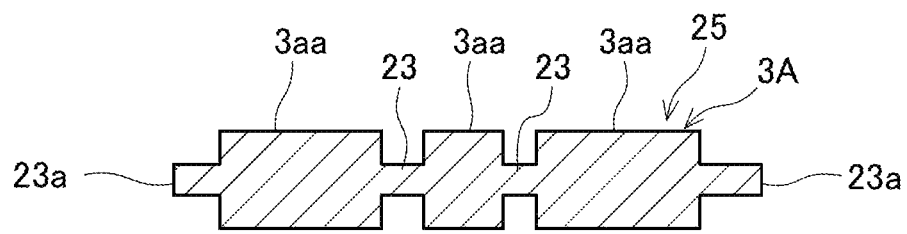
FIG. 11 is a schematic sectional view illustrating an alkali-peeling situation at a peeling device in the pattern formation device.

FIG. 7 is a schematic sectional view illustrating a laminating situation of a first laminating device in the pattern formation device. FIG. 8 is a schematic sectional view illustrating an exposure situation at an exposure device in the pattern formation device. FIG. 9 is a schematic sectional view illustrating a developing situation at a developing device in the pattern formation device. FIG. 10 is a schematic sectional view illustrating a double-side etching situation at a double-side etching device in the pattern formation device. FIG. 11 is a schematic sectional view illustrating an alkali-peeling situation at an alkali-peeling device in the pattern formation device.

Figure 12:
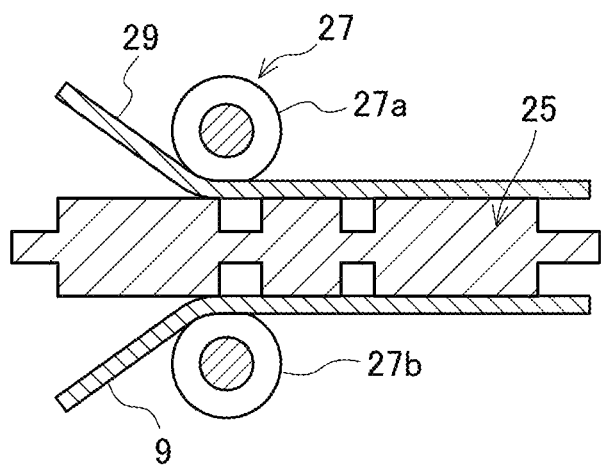
FIG. 12 is a schematic sectional view illustrating a laminating situation at a second laminating device in a circuit formation device.
Figure 13:
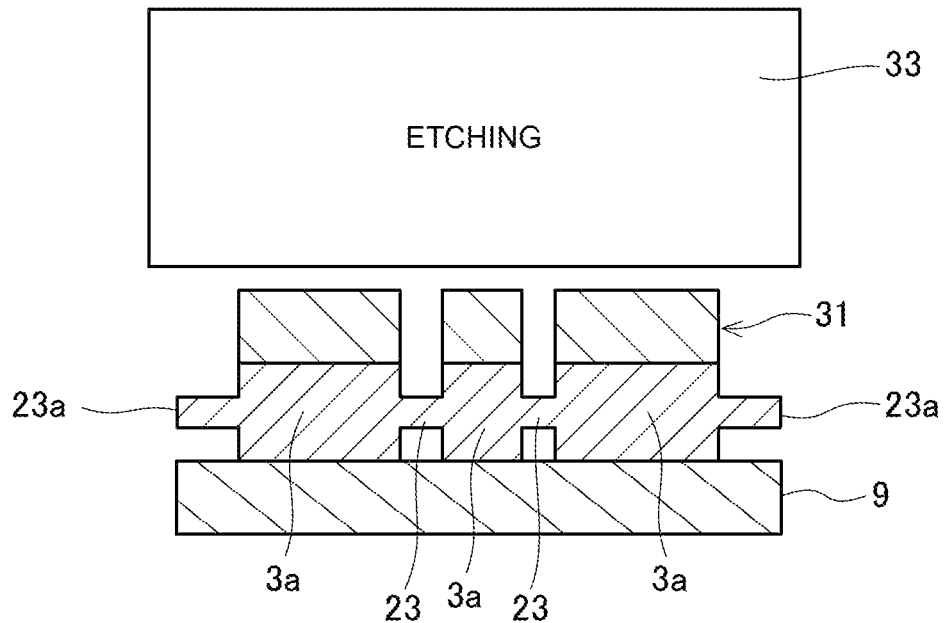
FIG. 13 is a schematic sectional view illustrating a single-side etching situation at a single-side etching device in the circuit formation device.

FIG. 12 is a schematic sectional view illustrating a laminating situation at a second laminating device in the circuit formation device. FIG. 13 is a schematic sectional view illustrating a single-side etching situation at a single-side etching device in the circuit formation device.

Figure 14:
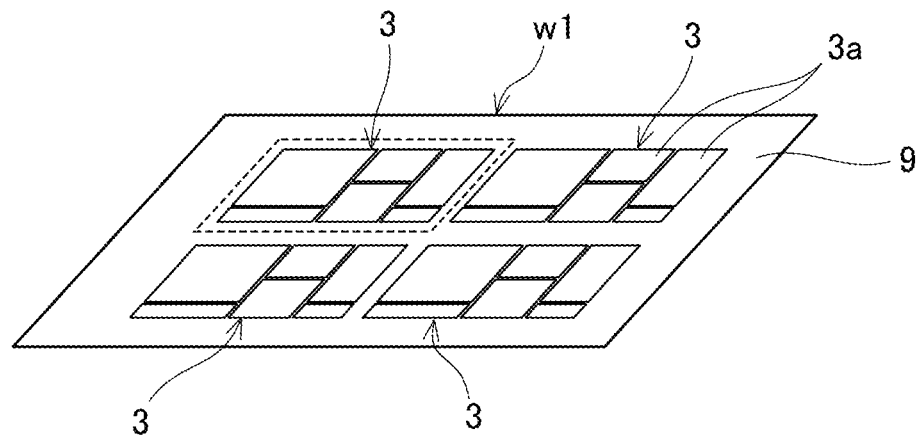
FIG. 14 is a perspective view illustrating a cutting image of the circuit pattern from the semi-finished base material for a circuit substrate.
Figure 15:
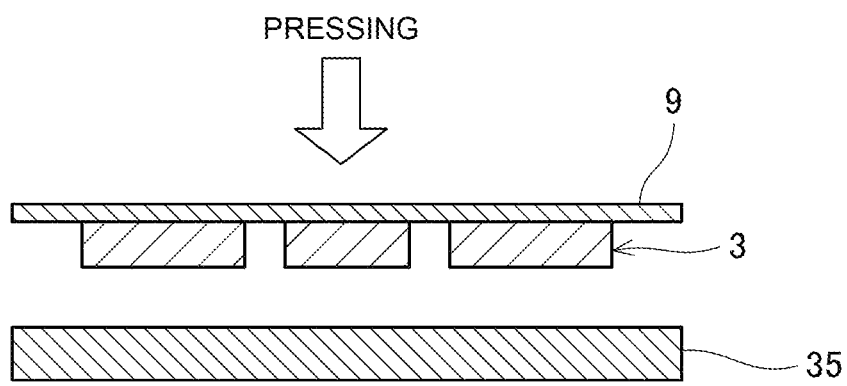
FIG. 15 is a schematic sectional view illustrating transference of the circuit pattern to a cushion material.
Figure 16:
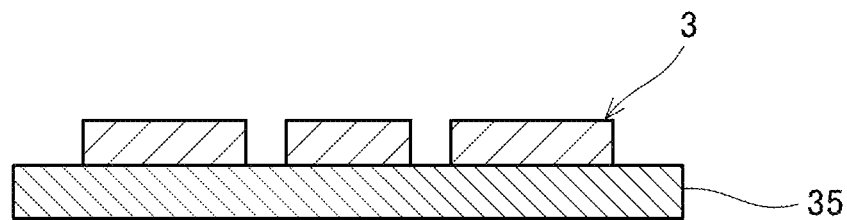
FIG. 16 is a schematic sectional view of the cushion material to which the circuit pattern is transferred.
Figure 17:
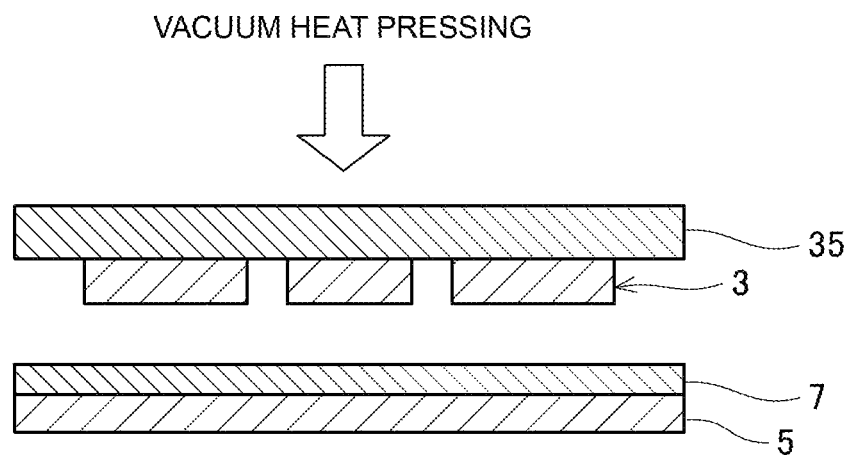
FIG. 17 is a schematic sectional view illustrating vacuum heat pressing to transfer the circuit pattern to an insulating layer on a metal substrate.
Figure 18:
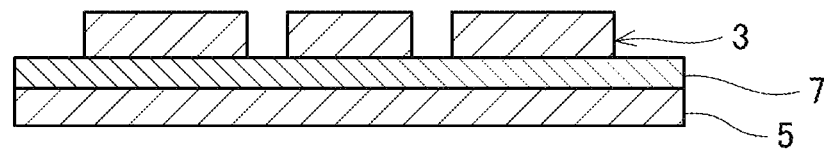
FIG. 18 is a schematic sectional view of the metal-based circuit substrate.

Further, the substrate-layering step S11-S14 of FIG. 6 will be explained further with reference to FIG. 14-FIG. 19. FIG. 14 is a perspective view illustrating a cutting image of the circuit pattern from the semi-finished base material for a circuit substrate. FIG. 15 is a schematic sectional view illustrating transference of the circuit pattern to a cushion material. FIG. 16 is a schematic sectional view of the cushion material to which the circuit pattern is transferred. FIG. 17 is a schematic sectional view illustrating vacuum heat pressing to transfer the circuit pattern to an insulating layer on the metal substrate. FIG. 18 is a schematic sectional view of the metal-based circuit substrate. FIG. 19(A) is a schematic sectional view illustrating the circuit pattern on the protection film cut off from the semi-finished base material for a circuit substrate. FIG. 19(B) is a schematic sectional view illustrating the circuit pattern transferred to the cushion material. FIG. 19(C) is a schematic sectional view illustrating the circuit pattern transferred to the insulating layer on the metal substrate.

In FIG. 5, the step S1 is a first-film-laminating step of the pattern formation step. This step is realized by film laminating at the first laminating device 11 of FIG. 7 included in the pattern formation device.

Namely, the copper plate material W as the material plate is cut in a substrate size in advance, and is fed between rolls 11a and 11b of the first laminating device 11 together with dry films 13a and 13b. With this step, the dry films 13a and 13b are stuck on an obverse and a reverse of the copper plate material W. For the dry films 13a and 13b, a dry film with a thickness of about 100 μm is used. A dry film with another thickness, for example, of about 40 μm may be, however, used for the dry films 13a and 13b.

The step S2 is an exposure step of the pattern formation step. This step is realized by exposure at the exposure device 15 of FIG. 8 included in the pattern formation device. In this step, exposure films 17a and 17b are arranged on the dry films 13a and 13b on the obverse and the reverse of the copper plate material W in which the dry films 13a and 13b are stuck on the obverse and the reverse and exposure is performed.

The step S3 is a developing step of the pattern formation step. This step is realized by developing at the developing device (not illustrated) included in the pattern formation device as illustrated in FIG. 9. This step develops the dry films 13a and 13b on the obverse and the reverse of the copper plate material W exposed at the step S2 to remove uncured portion through the exposure. Portions of the copper plate material W exposed outside by the removing are portions not to be the circuit pattern. Namely, the remaining dry films 13a and 13b after the developing form a resist pattern 19 corresponding to the circuit pattern 3.

The step S4 is a double-side etching step of the pattern formation step. This step is realized by the double-side etching at the double-side etching device 21 of FIG. 10 included in the pattern formation device. This step sprays etching liquid of ferric chloride from the obverse and the reverse of the copper plate material W using the double-side etching device 21 to perform the double-side etching. As the etching liquid, cupric chloride liquid or alkali-etching liquid may be used. It should be noted that the double-side etching device 21 is just schematically illustrated in FIG. 10. As the double-side etching device 21, an appropriate known double-side etching machine may be employed.

The double-side etching is performed by spraying at liquid temperature of 45° C., and spray pressure of 0.4 Pa for etching time of about 30 minutes. A condition of the double-side etching such as the liquid temperature may be, however, variously altered according to the setting of the connection portions 23 and the tongue 23a.

With the double-side etching, a shape in which portions 3aa corresponding to the individual circuit conductors 3a composing the circuit pattern 3 are connected through the relatively thin connection portions 23 is formed. The tongue portion 23a is formed on an outermost circumference of a portion 3A corresponding to the circuit pattern composed of the portions 3aa corresponding to the circuit conductors 3a, the tongue portion having a shape corresponding to that of the connection portion 23. The tongue portion 23a is circumferentially shaped so as to entirely surround the portion 3A corresponding to the circuit pattern. A thickness, and a protruding dimension of the tongue portion 23a are sized equivalently with a thickness of the connection portion 23 and a dimension spanning between the circuit conductors 3a.

The step S5 is an alkali-peeling step of the pattern formation step. This step is realized by the alkali-peeling at the alkali-peeling device (not illustrated) included in the pattern formation device as illustrated in FIG. 11. This step removes the resist pattern 19 corresponding to the circuit pattern 3 using alkali-liquid after the developing, to form the semi-finished circuit pattern 25. In the semi-finished circuit pattern 25, the portions 3aa corresponding to the individual circuit conductors 3a composing the circuit pattern 3 are connected with each other by the relatively thin connection portions 23.

The step S6 is the second-film-laminating step of the circuit formation step. The second-film-laminating step composes the sheet-layering step together with an exposure step of the step S7, and a developing step of the step S8, to form a resist pattern 31 as explained later. This step is realized by film laminating at a second-laminating device 27 of FIG. 12 included in the circuit formation device.

In this step, the semi-finished circuit pattern 25 is fed between rolls 27a and 27b of the second-laminating device 27 together with a dry film 29 and a back protection film being the protection sheet 9.

With this step, the dry film 29 is stuck on an obverse face of the semi-finished circuit pattern 25, and the back protection film being the protection sheet 9 is stuck on a reverse face of the same. It should be noted that the obverse and the reverse of the semi-finished circuit pattern 25 are arbitrary selected. As the dry film 29, a dry film having a thickness of about 100 μm is used. A dry film with another thickness, for example, of about 40 μm may be, however, used as the dry film 29.

The step S7 is the exposure step of the circuit formation step, and the step S8 is the developing step of the circuit formation step. The steps S7 and S8 implement steps similar to the steps S2 and S3 of the pattern formation step. The steps S7 and S8 compose the sheet-layering step of the circuit formation step together with the step S6. The second-laminating device 27, the exposure device, and the developing device realizing the sheet-layering step compose the layering device.

The dry film 29 remaining after the developing in the step S8 forms the resist pattern 31 to expose the connection portions 23 on the obverse face being the one side face of the semi-finished circuit pattern 25 so as to correspond to the circuit pattern. On the reverse face being the other face of the semi-finished circuit pattern 25, the protection sheet 9 being the back protection film is layered and stuck.

The step S9 is a single-side etching of the circuit formation step. This step is realized by the single-side etching at the single-side etching device 33 of FIG. 13 included in the circuit formation device. This step sprays etching liquid of ferric chloride through the resist pattern 31 on the one side face using the single-side etching device 33 to perform the single-side etching. In addition, the single-side etching device 33 is just schematically illustrated in FIG. 13. As the single-side etching device 33, an appropriate known single-side etching machine may be employed.

As the etching liquid, cupric chloride liquid or alkali-etching liquid may be used similar to the above. The single-side etching is performed by spraying at liquid temperature of 45° C. and spray pressure of 0.4 Pa for etching time of about 5 minutes. A condition of the single-side etching such as the liquid temperature may be, however, variously altered according to thicknesses and positions of the connection portions 23 and the tongue 23a in the layer direction. With the single-side etching, the connection portions 23 and the tongue 23a are etched and removed.

The connection portions 23 and the tongue portion 23a are not completely removed and are remained so as to make the circumferential side faces of the circuit conductors 3a be the swelled shape. In this case, the etching liquid spreads the swelled shape entirely in the layer direction according to progress of the etching.

Accordingly, the surface of the swelled shape is formed as the face 3b being the arc-shaped convex surface 3b as illustrated in FIG. 4. A form of the convex surface of the face 3b may be adjusted according to the setting of the liquid temperature, the spray pressure and the etching time. The setting of a position of the face 3b between the upper and the lower faces 3c and 3d, a size of the swelled shape, and the widths of the upper and the lower faces 3c and 3d may be adjusted by the setting of the vertical position and thicknesses of the connection portions 23 and the tongue portion 23a, and the liquid temperature, the spray pressure, and the etching time of the single-side etching.

The step S10 is relates to a completing step of the circuit formation step. The completing step performs a step similar to the alkali-peeling step of the step S5. Namely, the resist pattern 31 is removed by alkali-peeling at an alkali-peeling device included in the circuit formation device after the single-side etching in the step S9. Consequently, the semi-finished base material W1 for a circuit substrate in FIG. 2 is obtained as the result. In the semi-finished base material W1 for a circuit substrate, the circuit pattern 3 is stuck on the back protection film being the protection sheet 9.

Using the semi-finished base material W1 for a circuit substrate obtained as illustrated in FIG. 2, the metal-based circuit substrate 1 is completed through the substrate-layering step S11-S14 of FIG. 6.

Namely, the circuit pattern 3 is cut out one by one from the semi-finished base material W1 for a circuit substrate as illustrated in FIG. 14, and the circuit pattern 3 is transferred at a bare face (obverse face) to the cushion material 35. Next, the back protection film is detached and the circuit pattern 3 is stuck, in a side from which the protection film is detached, on the insulating layer 7 on the metal substrate 5. Further, the cushion material 35 is detached, and the circuit pattern 3 is subjected to pressure heating process to complete the metal-based circuit substrate 1.

For more details, the step S11 in FIG. 6 is a cutting step of the substrate-layering step. This step cuts off the lump circuit pattern 3 from the semi-finished base material W1 for a circuit substrate obtained as the above as illustrated in FIG. 14. In this cutting-off, the protection sheet 9 is cut to cut off the lump circuit pattern 3 as well as the protection sheet.

The step S12 is a transference step. This step orients the obverse face of the circuit pattern 3 toward the obverse face of the cushion material 35 as illustrated in FIG. 15, and transfers the circuit pattern 3 to the cushion material 35 by pressing. At this time, mutual positions of the individual circuit conductors 3a of the circuit pattern 3 are accurately kept by the protection sheet 9.

The cushion material 35 is made of urethane having a thickness of 3-5 mm for example. The obverse face of the cushion material 35 is provided with an adhesive layer. The obverse face of the circuit pattern 3 is kept on the adhesive layer of the obverse face of the cushion material 35 with adhesion. Adhesion strength of the cushion material 35 is set higher than holding force based on the protection sheet 9 for the circuit pattern 3. The protection sheet 9 is, therefore, detached after the pressing, thereby transferring the circuit pattern 3 to the cushion material 35 as illustrated FIG. 16.

The step S13 is a vacuum heat pressing step. This step presses the circuit pattern 3 that is hold by the cushion material 35 to the insulating layer 7 on the metal substrate 5 by the vacuum heat pressing as illustrated in FIG. 17.

At this time, the cushion material 35 receives reaction force from each circuit conductor 3a and deforms at an adhering portion of each circuit conductor 3a, and the remaining portions other than the adhering portion of each circuit conductor 3a deform so as to reach the insulating layer 7. With the elasticity of the cushion material 35, each circuit conductor 3a is appropriately pressed on the uncured insulating layer 7 at the vacuum heat pressing.

The thickness of the cushion material 35 is, therefore, set according to the thickness of the circuit conductor 3a to be pressed. Namely, the cushion material 35 is thick for a thick circuit conductor 3a and is thin for a thin circuit conductor 3a. The relationship between these thicknesses may be set in relation to the elasticity of the cushion material 35 through a pre-experiment.

The step S14 is the completing step. This step detaches the cushion material 35 after curing the insulating layer 7. This completes the metal-based circuit substrate 1 of FIG. 18.

Relationships between the swelled shape and the processes of the steps S11-S14 is as illustrated in FIG. 19.

The lower face 3d of the individual circuit conductor 3a of the circuit pattern 3 is held by the protection sheet 9 cut out in the cutting step of the step S11, and the upper face 3c of the individual circuit conductor 3a is exposed outside. The face 3b having the swelled shape of the individual circuit conductor 3a is lower than the vertical center position of the circuit conductor 3a when the protection sheet 9 is positioned on the downside.

The individual circuit conductor 3a of the circuit pattern 3 is reversed through the transferring step of the step S12, the upper face 3c of the individual circuit conductor 3a is held by the cushion material 35, and the lower face 3d of the individual circuit conductor 3a is exposed outside. In this state, the face 3b is higher than the vertical center position of the circuit conductor 3a when the cushion material 35 is positioned on the downside.

In the vacuum heat pressing step and the completing step of the steps S13 and S14, the individual circuit conductor 3a is reversed again, and the lower face 3d is fixed to the insulating layer 7. The cushion material 35 is detached using a detaching roller (not illustrated) or the like after curing the insulating layer 7, thereby exposing the upper face 3c of each circuit conductor 3a outside. In the completed metal-based circuit substrate 1, the face 3b of the swelled shape of the individual circuit conductor 3a is lower than the vertical center position of the circuit conductor 3a when the insulating layer 7 is position on the downside.

It should be noted that the face 3b of the swelled shape of the individual circuit conductor 3a in the completed metal-based circuit substrate 1 may be higher than the vertical center position of the circuit conductor 3a when the insulating layer 7 is positioned on downside.

In this case, the face 3b of the swelled shape of the individual circuit conductor 3a is higher than the vertical center position of the circuit conductor 3a when the protection sheet 9 is positioned on the downside according to the cutting step of the step S11.

The face 3b in the transference step of the step S12 is lower than the vertical center position of the circuit conductor 3a when the cushion material 35 is positioned on the downside.

The face 3b in the vacuum heat pressing step and the completing step of the steps S13 and S14 is higher than the vertical center position of the circuit conductor 3a when the insulating layer 7 is positioned on the downside.

It should be noted that, although the cushion material 35 is used in the substrate-layering step of FIG. 6, it may be omitted. In this case, the protection sheet 9 may be substituted for the cushion material as it is to perform the vacuum heat pressing step S13 after the cutting step S11. This protection sheet 9 may have chemical resistance against the etching liquid and physical properties with a thickness and elasticity equivalent to the cushion material 35 in the vacuum heat pressing step of the step S13.

According to the embodiment of the present invention, the circuit pattern 3 comprising the circuit conductor 3a to be layered on the metal substrate 5 through the insulating layer 7, comprises the intermediate portion in the layer direction having the swelled shape in the layer-crossing direction in the sectional shape of the circuit conductor 3a, the swelled shape being formed by the gentle face 3b that is the arc-shaped convex surface continuous in the layer direction.

The volume of the circuit conductor 3a is, therefore, increased by the swelled shape of the face 3b. In particular, the arc-shaped convex surface surely increases the volume of the circuit conductor 3a without forming the swelled shape into a sharply pointed shape. With the volume increase of the circuit conductor 3a, the swelled shape is easily applied to current increase and is advantageous in large current.

Since the swelled shape is formed by the face 3b gentle in the layer direction, short circuit is suppressed at the faces 3b between adjacent circuit conductors 3a. In particular, the arc-shaped convex surface surely suppresses short circuit between the circuit conductors 3a at the swelled shapes.

With the swelled shape at the intermediate portion, the width of the lower face 3d of the circuit conductor 3a layered on the insulating layer 7 is made narrower than the width between the faces 3b at the intermediate portions while increasing the volume of the circuit conductor 3a. The width of the circuit conductor 3a is smaller at the portion of the lower face 3d to suppress short circuit between adjacent circuit conductors 3a and generation of ion migration.

Since short circuit is suppressed between adjacent circuit conductors 3a and generation of ion migration is suppressed, it allows the circuit pattern 3 to be tightly arranged.

In the circuit conductor 3a, the width of the lower face 3d contacting the insulating layer 7 in the cross section in the layer direction is narrower than the width of the upper face 3c. With the setting of the widths of the upper and the lower faces 3c and 3d, short circuit is suppressed between adjacent circuit conductors 3a and generation of ion migration is suppressed at the lower faces 3d. At the upper faces 3c, disconnection is suppressed.

In the semi-finished base material W1 for a circuit substrate, the circuit pattern 3 is layered on the protection sheet 9 being the back protection film.

The protection sheet 9 protects the back of the circuit pattern 3 from the etching liquid at the time of the single-side etching. Further, the protection sheet 9 allows the result to be handled as the semi-finished base material W1 for a circuit substrate in which the circuit pattern 3 is layered on the protection sheet 9 and facilitates to keep the semi-finished base material in stock.

The circuit pattern 3 of the semi-finished base material W1 for a circuit substrate is formed of the copper plate material W with the thickness of 3.0 mm more than 0.8 mm. With the thickness of the circuit pattern 3, it is applicable to large current.

In the metal-based circuit substrate 1, the circuit pattern 3 is layered on the metal substrate 5 through the insulating layer 7. With the layering, it obtains the metal-based circuit substrate 1 having the circuit pattern 3 exhibiting the aforementioned effect.

The production method for a circuit pattern, comprises the pattern formation step S1-S5 performing the double-side etching to the copper plate material W to form the semi-finished circuit pattern 25 in which the portions 3aa corresponding to the individual circuit conductors 3a composing the circuit pattern 3 are connected through the relatively thin connection portions 23, and the circuit formation step S6-S10 performing the single-side etching to the connection portions 23 from the one side face of the semi-finished circuit pattern 25 to form the circuit pattern 3 in which the intermediate portions of the circuit conductors 3a in the cross section in the layer direction is formed into the swelled shape and the swelled shape is formed with the face 3b gentle in the layer direction.

The pattern formation step S1-S5 of the production method for a circuit pattern forms the semi-finished circuit pattern 25 by the double-side etching. The circuit formation step S6-S10 forms the circuit pattern 3 using the semi-finished circuit pattern 25.

The pattern formation step S1-S5 circumferentially forms the tongue portion 23a on the outermost circumference of the portion 3A of the semi-finished circuit pattern 25 corresponding to the circuit pattern 3 together with the connection portions 23, the tongue portion having the shape corresponding to the connection portions.

With the tongue portion 23a, the intermediate portion of the circuit conductor 3a in the cross section in the layer direction is formed into the swelled shape and the swelled shape is formed with the face 3b gentle in the layer direction even on the outermost circumference of the circuit pattern 3.

The circuit formation step S6-S10 includes the sheet-layering step S6-S8 that forms the resist pattern 31 on the one side face of the semi-finished circuit pattern 25 to expose the connection portions 23 and the tongue portion 23a outside and layers the protection sheet 9 on the other side face of the semi-finished circuit pattern 25, and the circuit formation step S6-S10 performs the single-side etching from the one side face through the resist pattern 31.

With the single-side etching, the swelled shapes of the gentle faces 3b are formed on the circumferential faces of the circuit conductors 3a. The face 3b may be formed into the arc-shaped convex surface according to the setting of the liquid temperature, the spray pressure, and the etching time of the single-side etching.

The circuit formation step S6-S10 removes the resist pattern 31 after the single-side etching to form the semi-finished base material W1 for a circuit substrate having the circuit pattern 3 layered on the protection sheet 9. The semi-finished base material W1 for a circuit substrate facilitates to be handled and kept in stock.

The semi-finished base material W1 for a circuit substrate is used to produce the metal-based circuit substrate 1, thereby obtaining the metal-based circuit substrate 1 having the circuit pattern 3 exhibiting the aforementioned effect.

The production device for a circuit pattern, comprises the pattern formation device performing the double-side etching to the copper plate material W to form the semi-finished circuit pattern 25 in which the portions 3aa corresponding to the individual circuit conductors 3a composing the circuit pattern 3 are connected through the relatively thin connection portions 23, and the circuit formation device performing the single-side etching to the connection portions 23 from the one side face of the semi-finished circuit pattern 25 to form the circuit pattern 3 in which the intermediate portions of the circuit conductors 3a in the cross section in the layer direction are formed into the swelled shape and the swelled shape is formed with the face 3b gentle in the layer direction.

The production device for a circuit pattern realizes the production method for a circuit pattern, to obtain the circuit pattern 3 with the swelled shape formed with the gentle face 3b in the layer direction.

The production device for a circuit pattern comprises the second laminating device 27 as the layering device that forms the resist pattern 31 on the one side face of the semi-finished circuit pattern 25 to expose the connection portions 23 outside and layers the protection sheet 9 on the other side face of the semi-finished circuit pattern 25, the exposure device, and the developing device, wherein the circuit formation device performs the single-side etching from the one side face through the resist pattern 31.

The production device for a circuit pattern realizes the production method for a circuit pattern, and the circuit formation device obtaining the circuit pattern 3 with the swelled shape formed with the gentle face 3b removes the resist pattern 9 after the single-side etching to form the semi-finished base material W1 for a circuit substrate having the circuit pattern 3 layered on the protection sheet 9.

Using the production device for a circuit pattern, the semi-finished base material W1 for a circuit substrate for the circuit pattern 3 with the swelled shape formed with the gentle face 3b in the layer direction is obtained.

The invention claimed is:

1. A circuit pattern comprising a circuit conductor to be layered on a metal substrate through an insulating layer, comprising:
    an intermediate portion in a layer direction having a swelled shape in a layer-crossing direction in a cross section of the circuit conductor, wherein
    the swelled shape is formed by a gentle etched face in the layer direction, and the circuit pattern has a thickness more than 0.8 mm.

2. The circuit pattern according to claim 1, wherein the gentle face in the layer direction is a convex surface in the layer-crossing direction.

3. The circuit pattern according to claim 2, wherein in the circuit conductor, a width of a lower face contacting the insulating layer is wider than a width of an upper face in the cross section in the layer direction, or the width of the lower face contacting the insulating layer is narrower than the width of the upper face in the cross section in the layer direction.

4. A semi-finished base material for a circuit substrate, comprising:
    the circuit pattern according to claim 1, wherein the circuit pattern is layered on a protection sheet.

5. A metal-based circuit substrate in which a circuit pattern comprising a circuit conductor is layered on an obverse face of an insulating layer layered on a metal substrate, comprising:

an intermediate portion in a layer direction having a swelled shape in a layer-crossing direction relative to at least a portion located on an obverse face of the insulating layer in a cross section of the circuit conductor wherein the swelled shape is formed by a gentle etched face in the layer direction, and the circuit pattern has a thickness more than 0.8 mm.

6. A metal-based circuit substrate in which the conductor pattern according to claim 1 is layered, wherein the circuit pattern is layered on the metal substrate through the insulating layer.

7. A production method for a circuit pattern, comprising:

a pattern formation step performing double-side etching to a material plate to form a semi-finished circuit pattern in which portions corresponding to individual circuit conductors composing a circuit pattern are connected through relatively thin connection portions; and a circuit formation step performing single-side etching to the connection portions from one side face of the semi-finished circuit pattern to form a circuit pattern in which intermediate portions of the circuit conductors in a cross section in a layer direction are formed into a swelled shape and the swelled shape is formed with a gentle face in the layer direction.

8. The production method for a circuit pattern according to claim 7, wherein the pattern formation step forms the semi-finished circuit pattern being circumferentially provided with a tongue portion on an outermost circumference of a portion of the semi-finished circuit pattern corresponding to the circuit pattern, the tongue portion having a shape corresponding to the connection portions, and the circuit formation step performs the single-side etching to the connection portions and the tongue portion to form the swelled shape.

9. The production method for a circuit pattern according to claim 8, wherein the circuit formation step includes a sheet-layering step that forms a resist pattern on the one side face of the semi-finished circuit pattern to expose the connection portions and the tongue portion outside and layers a protection sheet on the other side face of the semi-finished circuit pattern, and the circuit formation step performs the single-side etching from the one side face through the resist pattern.

10. The production method for a circuit pattern according to claim 7, wherein the circuit formation step includes a sheet-layering step that forms a resist pattern on the one side face of the semi-finished circuit pattern to expose the connection portions outside and layers a protection sheet on the other side face of the semi-finished circuit pattern, and the circuit formation step performs the single-side etching from the one side face through the resist pattern.

11. The production method for a circuit pattern according to claim 10, wherein the circuit formation step removes the resist pattern after the single-side etching to form a semi-finished base material for a circuit substrate having the circuit pattern layered on the protection sheet.

12. A production device for a circuit pattern, comprising:

a pattern formation device performing double-side etching to a material plate to form a semi-finished circuit pattern in which portions corresponding to individual circuit conductors composing a circuit pattern are connected through relatively thin connection portions; and a circuit formation device performing single-side etching to the connection portions from one side face of the semi-finished circuit pattern to form the circuit pattern in which intermediate portions of the circuit conductors in a cross section in a layer direction are formed into a swelled shape and the swelled shape is formed with a gentle face in the layer direction.

13. The production device for a circuit pattern according to claim 12, further comprising:

a layering device that forms a resist pattern on the one side face of the semi-finished circuit pattern to expose the connection portions outside and layers a protection sheet on the other side face of the semi-finished circuit pattern, wherein the circuit formation device performs the single-side etching from the one side face through the resist pattern.

14. The production device for a circuit pattern according to claim 13, wherein the circuit formation device removes the resist pattern after the single-side etching to form a semi-finished base material for a circuit substrate having the circuit pattern layered on the protection sheet.

* * * * *